United States Patent [19]
Hammerl et al.

[11] Patent Number: 5,543,348
[45] Date of Patent: Aug. 6, 1996

[54] CONTROLLED RECRYSTALLIZATION OF BURIED STRAP IN A SEMICONDUCTOR MEMORY DEVICE

[75] Inventors: Erwin Hammerl; Jack A. Mandelman, both of Stormville; Herbert L. Ho, Washingtonville; Junichi Shiozawa; Reinhard J. Stengl, both of Wappingers Falls, all of N.Y.

[73] Assignees: Kabushiki Kaisha Toshiba, Kawasaki, Japan; Siemens Aktiengesellschaft, Munich, Germany; International Business Machines Corp., Armonk, N.Y.

[21] Appl. No.: 412,442

[22] Filed: Mar. 29, 1995

[51] Int. Cl.$^6$ ............................................. H01L 21/8242
[52] U.S. Cl. ............................ 437/60; 437/78; 437/190
[58] Field of Search .............................. 437/47, 60, 78, 437/79, 190, 919; 148/DIG. 14

[56] References Cited

U.S. PATENT DOCUMENTS

| | | | |
|---|---|---|---|
| 4,444,620 | 4/1984 | Kovacs et al. | 156/657 |
| 4,509,990 | 4/1985 | Vasudev | 148/1.5 |
| 4,584,025 | 4/1986 | Takaoka et al. | 148/1.5 |
| 4,659,392 | 4/1987 | Vasudev | 148/1.5 |
| 4,716,548 | 12/1987 | Mochizuki | 365/149 |
| 4,753,895 | 6/1988 | Mayer et al. | 437/21 |
| 4,816,893 | 3/1989 | Mayer et al. | 357/42 |
| 4,820,652 | 4/1989 | Hayashi | 437/78 |
| 4,824,793 | 4/1989 | Richardson et al. | 437/47 |
| 4,826,300 | 5/1989 | Efron et al. | 350/342 |
| 4,849,371 | 7/1989 | Hansen et al. | 437/82 |
| 4,853,342 | 8/1989 | Taka et al. | 437/31 |
| 4,910,709 | 3/1990 | Dhong et al. | 365/149 |
| 4,915,746 | 4/1990 | Welsch | 148/4 |
| 4,916,524 | 4/1990 | Teng et al. | 357/23.6 |
| 4,942,554 | 7/1990 | Kircher et al. | 365/149 |
| 4,988,637 | 1/1991 | Dhong et al. | 437/52 |
| 5,116,768 | 5/1992 | Kawamura | 437/21 |
| 5,138,420 | 8/1992 | Komori et al. | 357/42 |
| 5,168,073 | 12/1992 | Gonzalez et al. | 437/47 |
| 5,168,366 | 12/1992 | Sasaki | 257/297 |
| 5,185,294 | 2/1993 | Lam et al. | 437/193 |
| 5,192,703 | 3/1993 | Lee et al. | 437/52 |
| 5,262,662 | 11/1993 | Gonzalez et al. | 257/307 |
| 5,292,678 | 3/1994 | Dhong et al. | 437/50 |
| 5,308,783 | 5/1994 | Krautschneider et al. | 437/52 |
| 5,312,768 | 5/1994 | Gonzalez | 437/40 |
| 5,336,629 | 8/1994 | Dhong et al. | 437/52 |
| 5,360,758 | 11/1994 | Bronner et al. | 437/60 |
| 5,376,566 | 12/1994 | Gonzalez | 437/35 |
| 5,380,673 | 1/1995 | Yang et al. | 437/47 |
| 5,413,950 | 5/1996 | Chen et al. | 437/52 |
| 5,422,294 | 6/1995 | Noble, Jr. | 437/52 |

*Primary Examiner*—Chandra Chaudhari
*Attorney, Agent, or Firm*—Banner & Allegretti, Ltd.

[57] ABSTRACT

A method of forming a coupled capacitor and transistor is provided. A trench is formed in a semiconductor substrate and an impurity-doped first conductive region is then formed by filling the trench with an impurity-doped first conductive material. The impurity-doped first conductive region is etched back to a first level within the trench. An insulating layer is then formed on a sidewall of the portion of the trench opened by the etching back of the impurity-doped first conductive region and a second conductive region is formed by filling the remainder of the trench with a second conductive material. The insulating layer and the second conductive region are etched back to a second level within the trench and an amorphous silicon layer is formed in the portion of the trench opened by the etching back of the insulating layer and the second conductive region. The undoped amorphous silicon layer is etched back to a third a level within the trench. The undoped amorphous silicon layer is then recrystallized. Impurities are outdiffused from the impurity-doped first conductive region to the semiconductor substrate through the recrystallized silicon layer. A source/drain region of the transistor is formed adjacent to an intersection of the trench and the surface of the semiconductor substrate. The outdiffused impurities and the recrystallized silicon layer constitute a buried strap for electrically connecting the first and second conductive layers in the trench to the source/drain region.

15 Claims, 10 Drawing Sheets

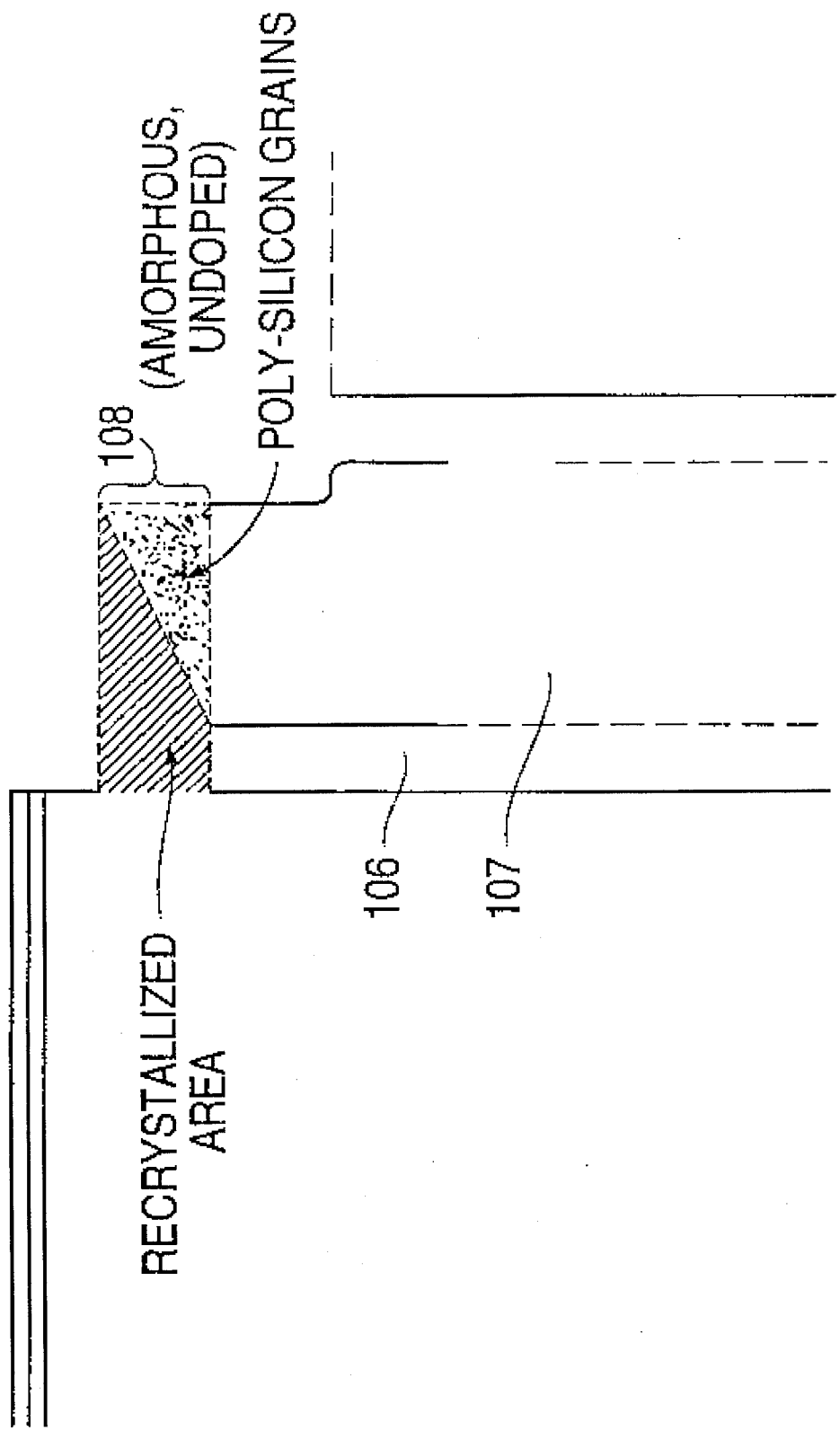

27;
CONTROLLED RECRYSTALLIZATION OF BURIED STRAP IN A SEMICONDUCTOR MEMORY DEVICE

BACKGROUND OF THE INVENTION

1. Technical Field

The present invention generally relates to a method of manufacturing a semiconductor memory device and, more particularly, to a method of forming a buried strap for electrically connecting a storage trench capacitor to a transfer gate in a trench-capacitor type DRAM cell.

2. Description of Related Art

FIG. 1 is a circuit diagram of a conventional memory cell 10 used in a dynamic random access memory (DRAM). Memory cell 10 includes a storage capacitor 15 for storing charges and a MOS transfer transistor (or "transfer gate") 20 for controlling charge transfer. One end of the source-drain path of MOS transistor 20 is connected to bit line BL and the other end of the source-drain path of MOS transistor 20 is connected to a first electrode of capacitor 15. A second electrode of capacitor 15 is connected to a predetermined potential such as ground potential. The gate of MOS transistor 20 is connected to word line WL to which signals are applied for controlling the transfer of charges between storage capacitor 15 and bit line BL, thereby reading and writing data. While it is desirable to increase the integration density of memory cells on a memory chip by making the MOS transfer transistor and the storage capacitor smaller, the capacitor must nonetheless be large enough to store sufficient charge for ensuring that data is correctly read from and written to the memory cell. So-called trench capacitors have been developed to increase the capacitance of the storage capacitor while permitting the integration density of the memory cells to be increased.

Various techniques have been employed to connect trench capacitors to surface-located transfer gates. For example, a self-aligned buried strap as described, in Nesbit et at., *A 0.6 µm² 256 Mb Trench DRAM Cell With Self-Aligned BuriEd STrap* (BEST), IEDM 93-627-630, may be used. FIGS. 2A and 2B illustrate the DRAM cell and buried strap described in the Nesbit et at. publication. Specifically, FIG. 2A illustrates a top-down view of a DRAM cell having a self-aligned buried strap and FIG. 2B is a cross-sectional view taken along line I–I' of FIG. 2A. DRAM cell 50 includes a trench capacitor 55 and a transfer gate 60. Trench capacitor 55 includes a first N+ polysilicon fill 65, a second N+ polysilicon fill 67, and a collar oxide 71. Transfer gate 60 includes N-type source/drain regions 73 and 74 formed in a P-well 75 and a polysilicon gate 77 insulatively spaced from the channel between source/drain regions 73 and 74. A bit line contact 79 electrically connects source/drain region 73 to bit line 81. A shallow trench isolation (STI) arrangement 80 electrically isolates DRAM cell 50 from an adjacent memory cell and passing word line 92. A diffusion region 83 is formed to electrically connect third polysilicon fill 69 and source/drain region 74 of MOS transfer gate 60 by outdiffusing dopants from the highly doped polysilicon fill in the storage trench into the P-well 75. Diffusion region 83 and third polysilicon fill 69 constitute a buried strap for connecting trench capacitor 55 to transfer gate 60.

However, several difficulties are associated with the buried strap concept. A first difficulty is that after the buried strap is formed, the thermal budget of the further semiconductor device fabrication process is limited. Exceeding this limit leads to an excessive outdiffusion from the trench polysilicon fill to underneath the transfer gate and towards neighboring memory cells. This dopant outdiffusion results in unacceptable changes of the transfer gate device characteristics as well as in possible electrical leakage between neighboring cells. With the shrinking design groundrule of high capacity DRAMs, the tolerable length of this outdiffusion also decreases. For example, in a 256 Mb Trench Capacitor DRAM cell with a 0.25 micrometer design groundrule and with the buried strap concept, only a 0.1 micrometer outdiffusion from the side of the trench is allowed.

Further, the limitation on the thermal budget after buried strap formation limits oxidation steps to low temperature and conflicts with the need for thermal anneals to heal implantation damage or to relieve stress built up in the silicon substrate during the fabrication process. During oxidation processes following the buried strap formation, oxygen can diffuse from the substrate surface into the collar oxide and oxidize the sidewalls of the polysilicon trench fill and the substrate as shown in FIG. 3. The collar oxide expands and forms a vertical bird's-beak-shape. This collar expansion leads to a high stress level and to generation of extended crystal defects in the substrate like dislocations and stacking faults around the most expanded part of the oxide collar. Extended crystal defects can cause electrical leakage across junctions. If the stress built up during one or several oxidation steps is below the critical level to generate crystal defects, and if there is enough thermal budget to relieve this stress by thermal anneals after the oxidation steps, the formation of extended crystal defects can be prevented. Therefore, a thermal budget which allows proper stress relief anneals is essential for a successful fabrication of a DRAM with the deep trench and buried strap concept.

Another difficulty related to the buried strap concept is the generation of extended crystal defects at the interface of polycrystalline trench fill 69 to the crystalline silicon substrate. This interface sits next to the area where the oxide collar expands most during the oxidation steps of the fabrication process and therefore is exposed to the highest stress field. During the oxidation steps, the polysilicon trench fill 69 contacting the single-crystalline silicon substrate starts to recrystallize in an uncontrolled manner over a distance which can be as far as the width of the collar oxide. Due to the inherent high stress field, crystal defects in the polysilicon grains (twins, stacking faults, etc.) act as seeds for defect formation at the interface to the neighboring substrate. Crystal defects are generated there and pushed far into the substrate.

SUMMARY OF THE INVENTION

In accordance with the present invention, a method of forming a coupled capacitor and transistor is provided. A trench is formed in a semiconductor substrate and an impurity-doped first conductive region is then formed by filling the trench with an impurity-doped first conductive material. The impurity-doped first conductive region is etched back to a first level within the trench. An insulating layer is then formed on a sidewall of the portion of the trench opened by the etching back of the impurity-doped first conductive region and a second conductive region is formed by filling the remainder of the trench with a second conductive material. The insulating layer and the second conductive region are etched back to a second level within the trench and an undoped amorphous silicon layer is formed in the portion of the trench opened by the etching back of the insulating layer and the second conductive region. The undoped amorphous silicon layer is etched back to a third level within the trench. The undoped amorphous silicon layer is then recrystallized. Impurities are subsequently outdiffused from the impurity-doped first conductive region to the semiconductor substrate through the recrystallized silicon layer. A source/drain region of the transistor is formed adjacent to an intersection of the trench and the surface of the semiconductor substrate. The outdiffused impurities and the recrystallized silicon layer constitute a buried strap for electrically connecting the first and second conductive layers in the trench to the source/drain region.

In accordance with the buried strap recrystallization described above, an additional thermal budget of, for example, at least 90 minutes at 1050° Celsius is achieved. This additional thermal budget can be used for appropriate stress relief anneals without resulting in any excessive dopant outdiffusion from the trench. In addition, the interface of the polysilicon and the single crystal silicon is moved away or recessed from the high stress area around the expanded collar oxide. This avoids the generation and extension of crystal defects into the semiconductor substrate.

These and other features and advantages of the present invention will be better understood from a reading of the following detailed description in conjunction with the accompanying drawings.

BRIEF DESCRIPTION OF THE DRAWINGS

FIG. 5 is a detailed illustration of the recrystallization of undoped amorphous silicon layer 107.

DETAILED DESCRIPTION

Figure 1:
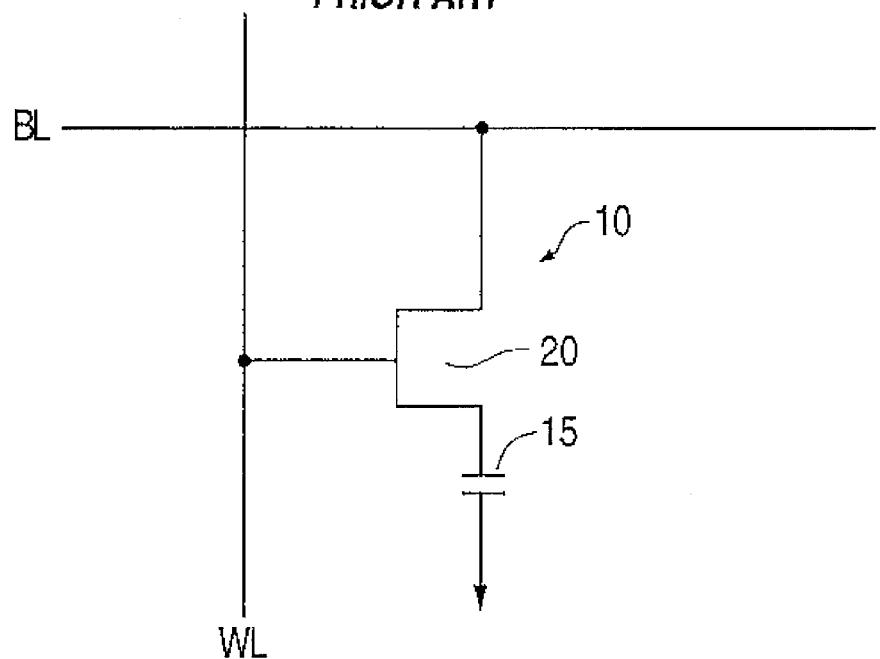
FIG. 1 is a circuit diagram of a conventional DRAM memory cell.
Figure 2A:
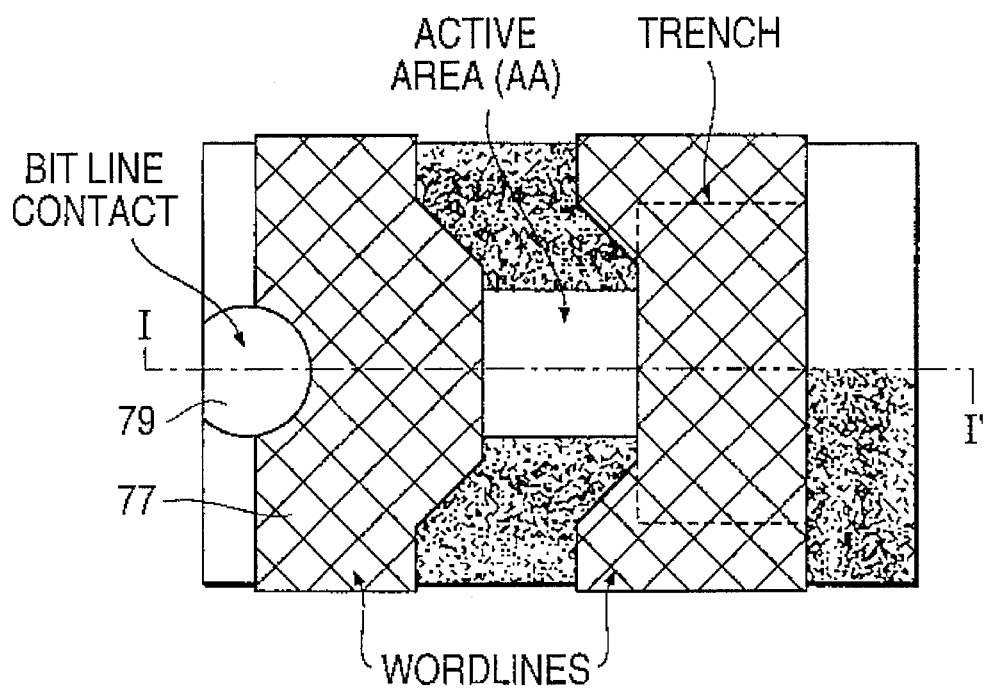
FIGS. 2A and 2B are top-down and cross-sectional views, respectively, of a DRAM cell with a self-aligned buried strap.
Figure 2B:
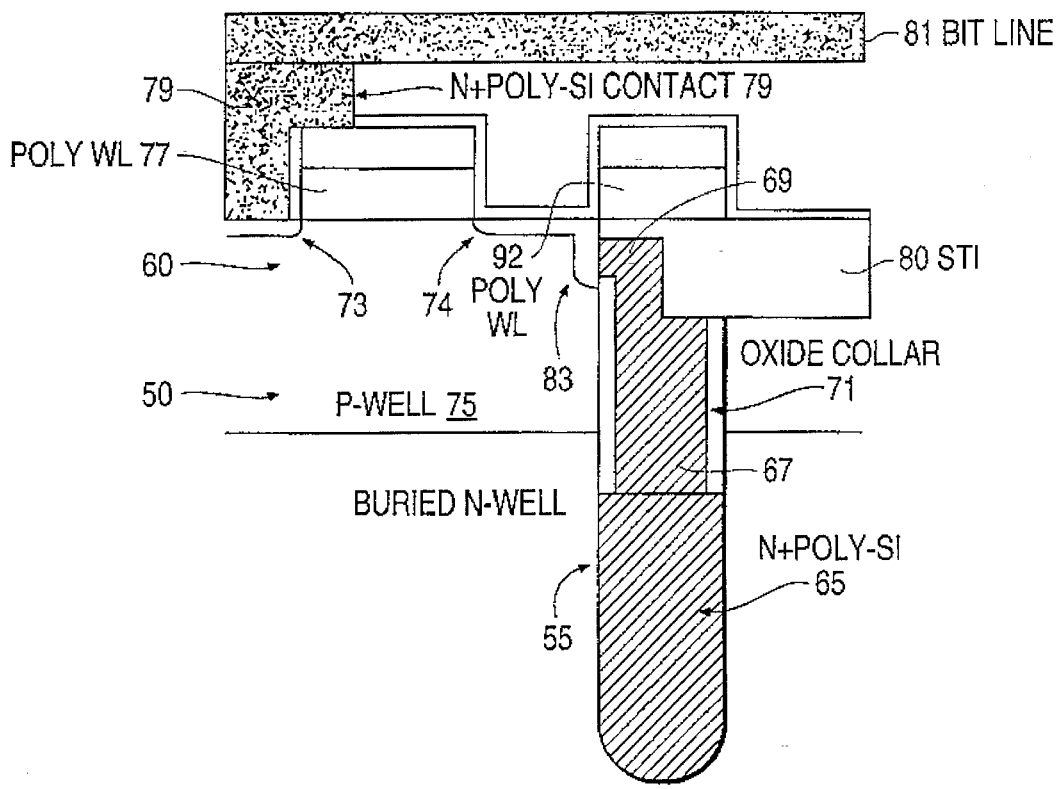
Figure 3:
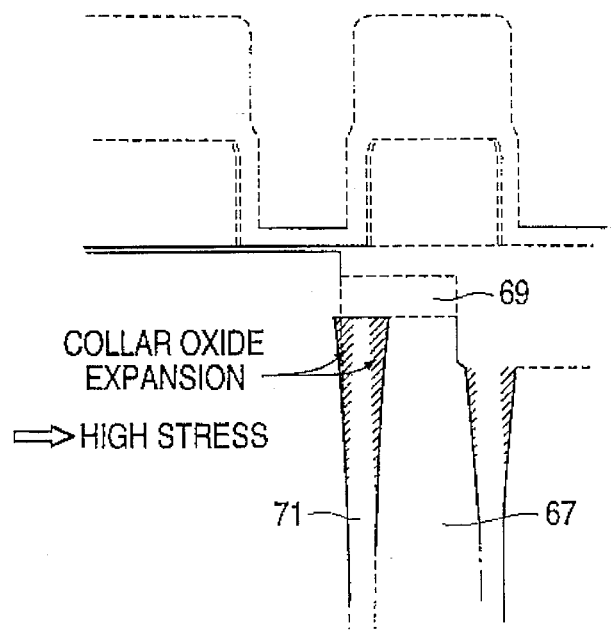
FIG. 3 illustrates the expansion of collar oxide 71 due to oxidation processes after buried strap formation.
Figure 4A:
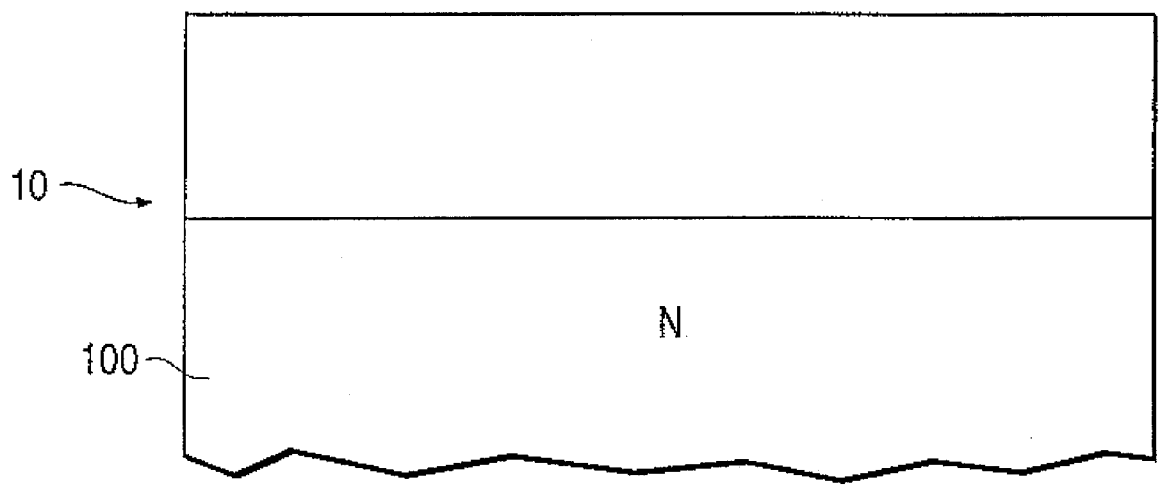
FIGS. 4A–4H illustrate the method of forming a semiconductor device in accordance with the present invention.
Figure 4B:
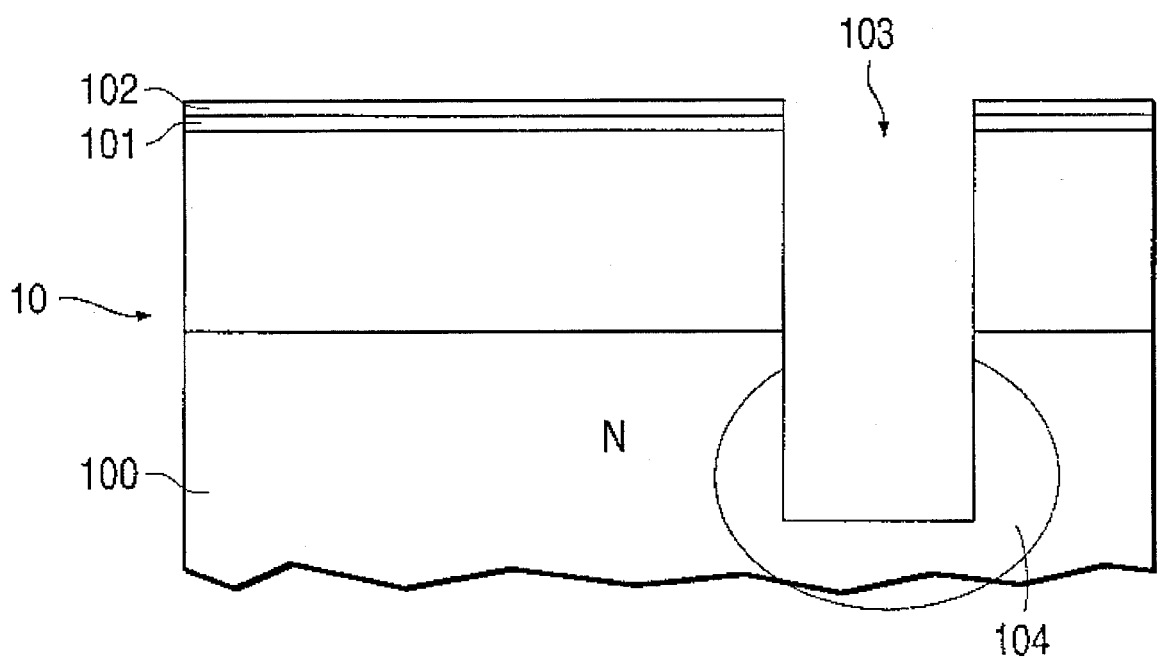
Figure 4C:
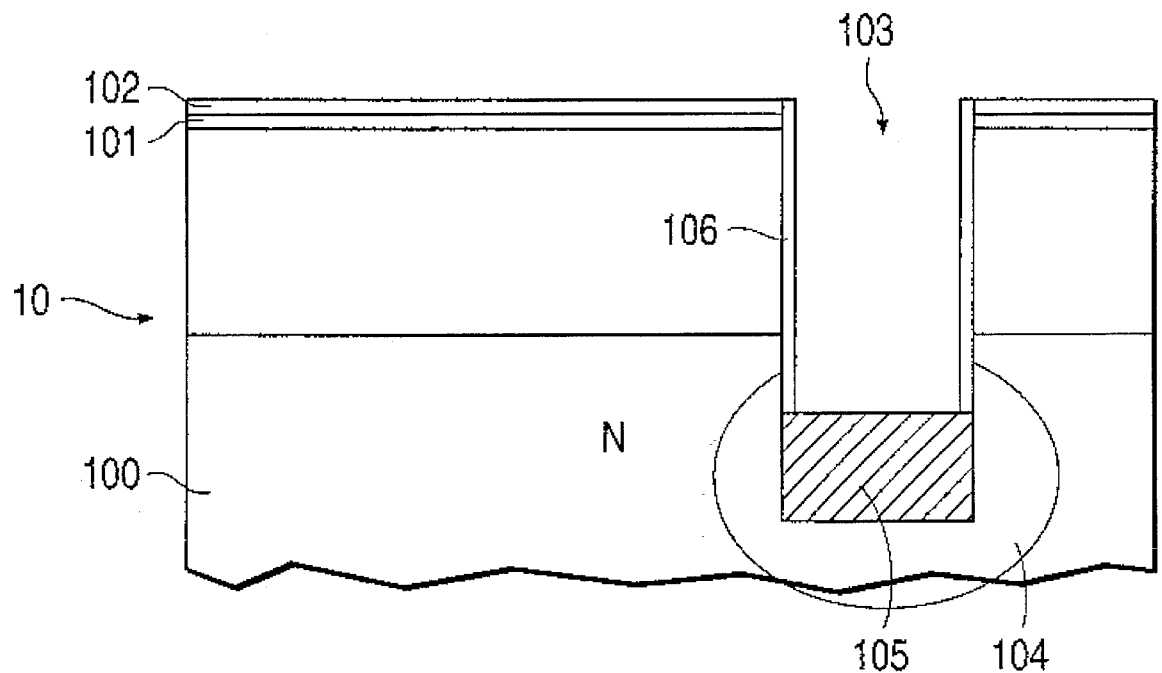

The present invention will be described in detail with reference to FIGS. 4A–4H. As shown in FIG. 4A, a buried N-type well 100 is formed in a P-type semiconductor substrate 10 by implanting phosphorous below the intended P-well for a memory cell array. A buried N-type well may also be formed by other methods, e.g., P-well implantation into an N-type semiconductor substrate or by epitaxy, and the invention is not limited in this respect. A silicon nitride layer 102 of about 0.2 micrometers is formed by chemical vapor deposition, for example, on the surface of a thin oxide layer 101 (e.g., about 10 nanometers) which is thermally grown on semiconductor substrate 10. Oxide layer 101 and silicon nitride layer 102 are patterned and etched to provide a mask for etching a trench 103. Trench 103 is etched using an anisotropic etching process to a depth of about 8 micrometers as shown in FIG. 4B. After storage node trench 103 is etched, an $N^+$-type capacitor plate 104 is formed by outdiffusing arsenic from the lower portion of trench 103. An oxidized nitride (ON) storage node dielectric (not shown) is then formed in trench 103. After the dielectric is formed, a first conductive region is formed by filling trench 103 with an impurity-doped first conductive material such as $N^+$-type polycrystalline silicon. The filling step may be carried out using chemical vapor deposition of silane or disilane, for example. The $N^+$-type polycrystalline silicon is then etched back to a first level within trench 103 using an isotropic etch process to form a first trench fill 105. The level of first trench fill 104 is about 1.0 micrometer below the surface of semiconductor substrate 10. A collar oxide 106 is then formed on the sidewall of the portion of trench 103 opened by the etching back of the $N^+$-type polycrystalline silicon using LPCVD or PECVD TEOS as shown in FIG. 4C.

Figure 4D:
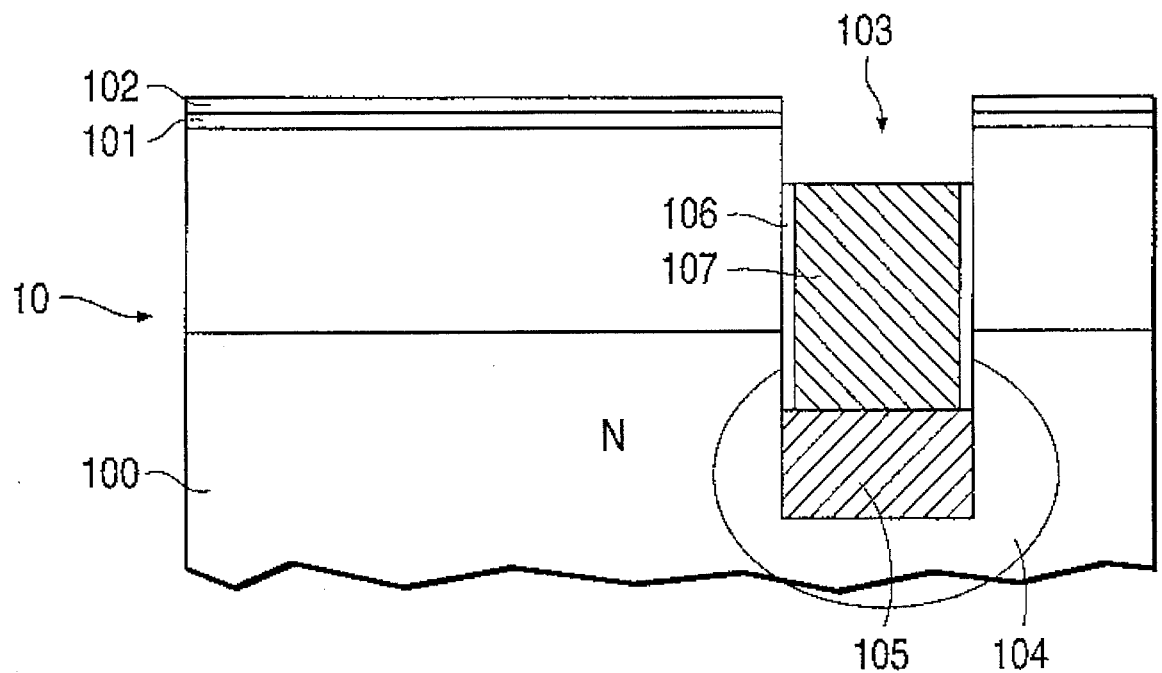

A second conductive region is formed by filling in the remainder of trench 103 with a second conductive material. The second conductive material may be, for example, $N^+$-type polycrystalline silicon or undoped polycrystalline silicon and may be formed by chemical vapor deposition. The second conductive material and the oxide collar 106 are then etched back to a second level within trench 103 to form a second trench fill 107 insulated from the semiconductor substrate by oxide collar 106 as shown in FIG. 4D. The depth of the buried strap to be formed in a subsequent process step is defined by this controlled etch-back of the second conductive material and oxide collar 106. Second trench fill 107 is etched back to about 0.1 micrometer below the surface of semiconductor substrate 10. An in-situ removal of a native oxide in trench 103 is then performed. In particular, it is important that a native oxide on the upper surface of second trench fill 106 and on the sidewall of trench 103 through which impurities for the buried strap will subsequently be outdiffused are removed. This removal of native oxide may be carried out by an in-situ prebake in a hydrogen ambient at a temperature greater than 850° Celsius, for example.

Figure 4E:
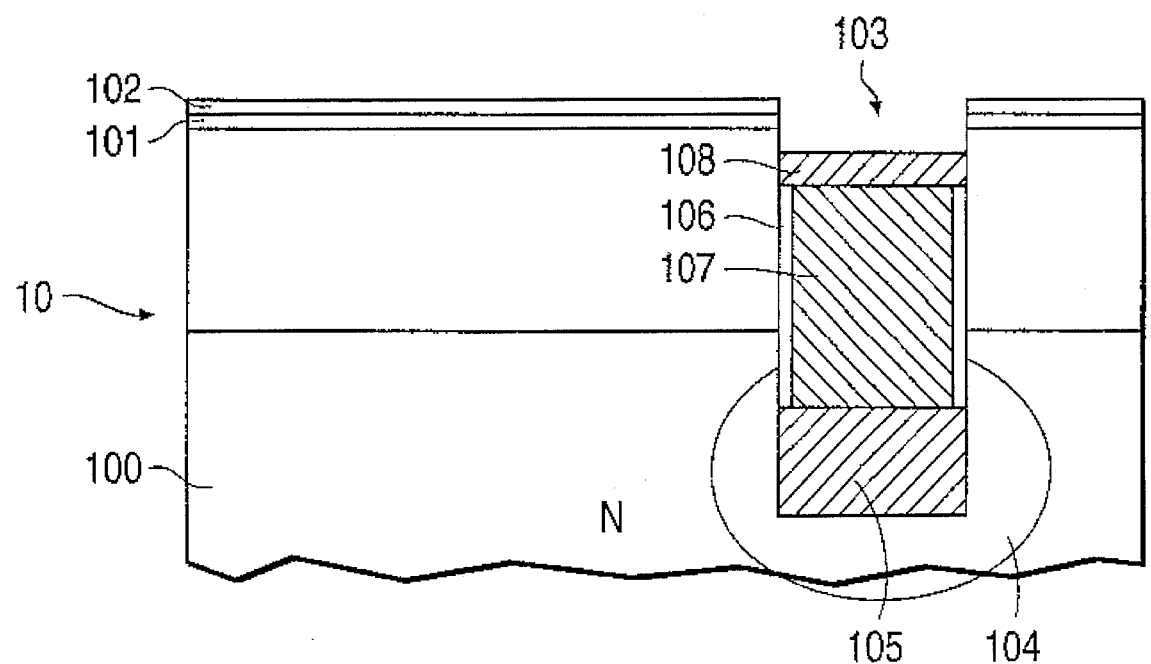
Figure 4F:
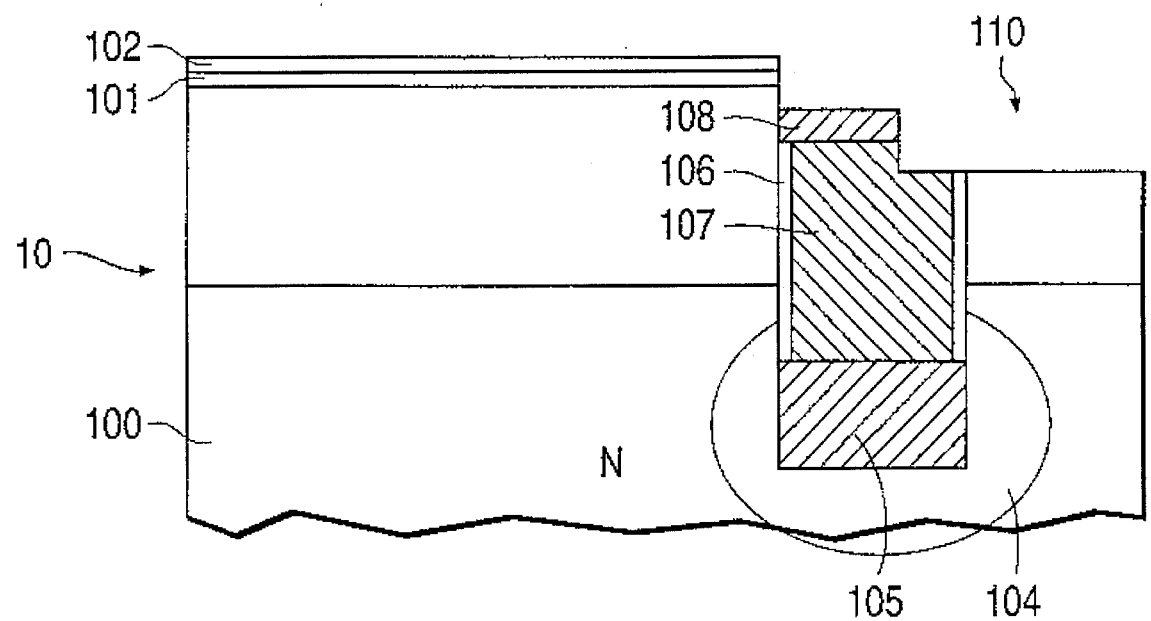

The portion of trench 103 opened by the etching back of oxide collar 105 and the second conductive material is then filled by amorphously depositing undoped silicon using chemical vapor deposition, for example. Although the amorphous silicon may be doped, this silicon will act as a diffusion barrier for dopants in the deep trench fill as will be explained below and is more effective in performing this function if undoped. The undoped amorphous silicon is then etched back using reactive ion etching, for example, to form a third trench fill 108 as shown in FIG. 4E. The amorphous silicon is preferably etched back to about 0.05 micrometer below the surface of semiconductor substrate 10 as determined by the tolerable resistance of the buried strap, and by the recess etch controllability. As will be discussed below, the recrystallization of third trench fill 108, as an extension of the buried strap, can be accomplished in a controlled manner if the undoped silicon is deposited amorphously. With reference to FIG. 4F, a reactive ion etch is performed to provide shallow trench 110 for shallow trench isolation. In general, shallow trench isolation is used to isolate discrete memory cell devices to prevent interference therebetween. Accordingly, a shallow trench such as shallow trench 110 is formed between adjacent deep trench configurations to ensure that they operate independently.

Figure 4G:
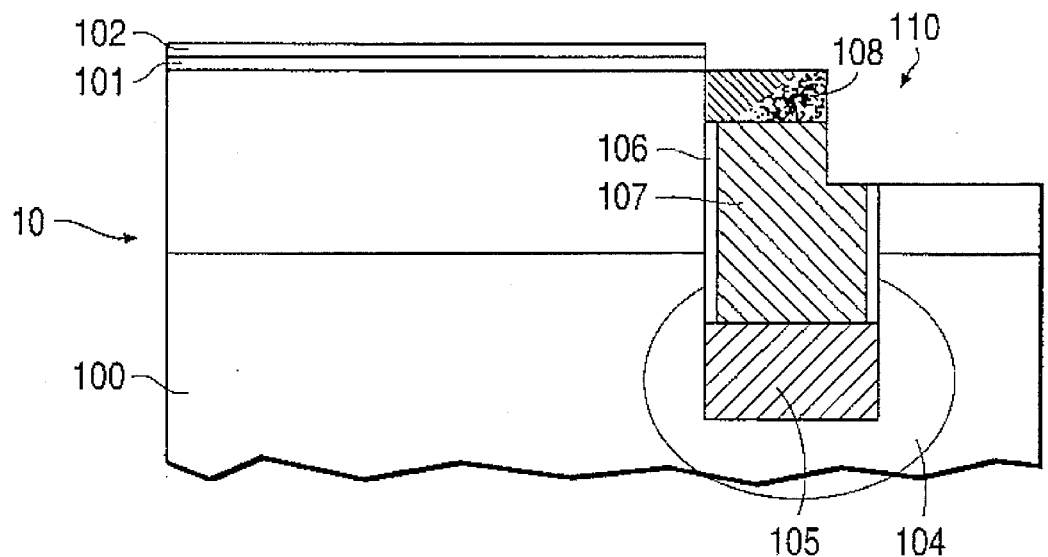
Figure 4H:
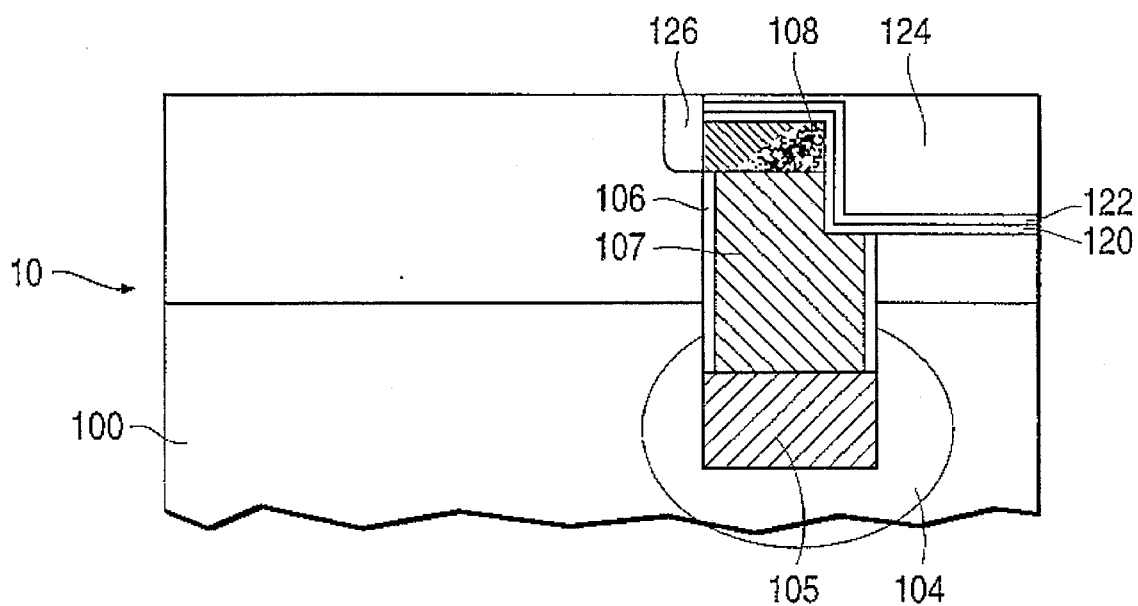

Then, the undoped amorphous silicon layer 108 is recrystallized as shown in FIG. 4G and in more detail in FIG. 5. The recrystallization is performed by heating at a temperature at which the amorphous silicon layer 108 begins to recrystallize, but at which the spontaneous formation of polysilicon is still prevented. A typical recrystallization temperature is around 550° C. and a typical temperature range for recrystallization is between about 500° and 700° C. The recrystallization rate of amorphous silicon depends exponentially on temperature: the lower the temperature, the longer the process time.

The extension of the recrystallized area is determined by the depth of the amorphous silicon layer 108. Because recrystallization simultaneously starts at the interface of amorphous silicon layer 108 and the substrate and at the interface of second conductive region 107 and amorphous silicon layer 108, a single crystalline area without any defects will be formed in the hatched area of FIG. 5. The dotted area in FIG. 5 contains polycrystalline grains. The diagonal line in between these two areas indicates the interface at which the recrystallizing front and the polysilicon front meet. Because the crystalline silicon substrate acts as a seed for the recrystallization, a native oxide in between the substrate and the amorphous silicon layer 108 as well as a native oxide in between second conductive region 107 and amorphous silicon layer 108 is not acceptable. Therefore the in-situ removal of the native oxide prior to deposition of the amorphous silicon as described above is important.

It is important to recrystallize the silicon layer 107 before the first oxidation process is performed. Only in this case is the interface of the poly-/single-crystalline silicon moved away from the high stress area around the expanded collar oxide. The recrystallization step can be easily integrated in the fabrication process if, for example, prior to a subsequent shallow trench isolation (STI) oxidation step, wafers are placed in a furnace at, for example, 550° C. and kept at this temperature under nitrogen ambient for some minutes (e.g., 10 minutes). As noted above, recrystallization time depends exponentially on temperature. The recrystallization time is also dependent on the quality of the amorphously deposited silicon.

Shallow trench 110 is then filled in to ensure isolation from adjacent trench structures. For example, with reference to FIG. 4H, an oxide lining 120 may be formed over the layer 107 and the interior surface of shallow trench 110. A nitride lining 122 may then be formed over oxide lining 120. The oxide and nitride linings 120, 122 serve to isolate collar oxide 105 from oxidant, and thereby suppress dislocation and stress. Finally, shallow trench 110 may be filled according to techniques known in the art. For example, an oxide 124 may be deposited to fill in shallow trench 110.

Other shallow trench isolation techniques may be used such as the technique described in U.S. application Ser. No. 08/351,161 entitled "Shallow Trench Isolation with Deep Trench Cap", which is incorporated herein by reference thereto.

During the complete DRAM fabrication process, impurities from the conductive regions within the trench are outdiffused to form strap portion 126. By virtue of the recrystallizing step described above, an additional thermal budget results, whereby stress relief anneals can be performed without the outdiffusion affecting the transfer gate characteristics or adjacent memory cells. These stress relief anneals are preferably carried out after oxidation steps which generate stress in the substrate (e.g., sacrificial gate oxide, gate oxide), or after ion implantation. In addition, since the interface of the poly/single crystalline silicon is moved away from the high stress area around the oxide collar, the generation and extension of crystal defects into the substrate is reduced.

A gate insulator may then be formed on the planar surface, and gate material may be deposited and patterned to form gate electrodes. Using the gate electrodes as masks, source/drain regions may be formed by ion implantation. Accordingly, transfer gates coupled to trench capacitors are realized. Interconnection between devices and metallization to the output terminals are conducted using techniques known in the art.

In accordance with the present invention, a simple, process-compatible method is provided for fabricating a diffusion-limiting interconnection between the polysilicon fill of a deep trench capacitor and the semiconductor substrate before a buried strap is outdiffused. This interconnection consists of undoped crystalline silicon of a defined width which has been formed by a controlled recrystallization of the upper part of the deep trench fill. An additional thermal budget is then given to allow proper stress relief anneals in the fabrication process of DRAM cells with deep trench and buried strap.

Figure 6A:
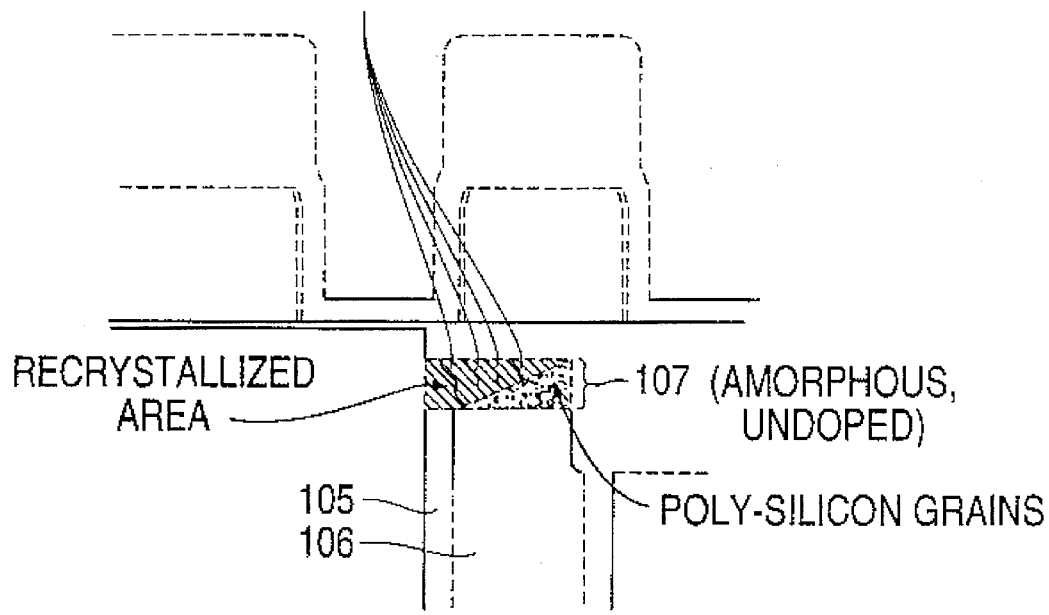
FIGS. 6A and 6B illustrate defects which are constrained in the trench fill and which extend into the semiconductor substrate, respectively.

The generation of extended defects in the silicon substrate is also prevented since the interface of the polysilicon trench fill and the crystallization substrate is recessed towards the trench fill, away from the high stress area around the upper collar oxide. Even if some defects like stacking faults or twins which lie on the {111} crystal planes are generated in the recrystallized part they are substantially constrained there because of geometrical reasons and do not extend into the substrate. Specifically, with reference to FIG. 6A, stacking faults and dislocations mostly lie on (111) crystal planes in the single crystalline silicon, i.e., under approximately 55° relative to the substrate surface. If the defect generating polysilicon/crystalline silicon interface is pulled back, then defects which originate at this interface have less probability of extending into the substrate. Defects which are confined within the third deep trench fill do not cross any electrical junctions, and therefore do not cause leakage.

Figure 6B:
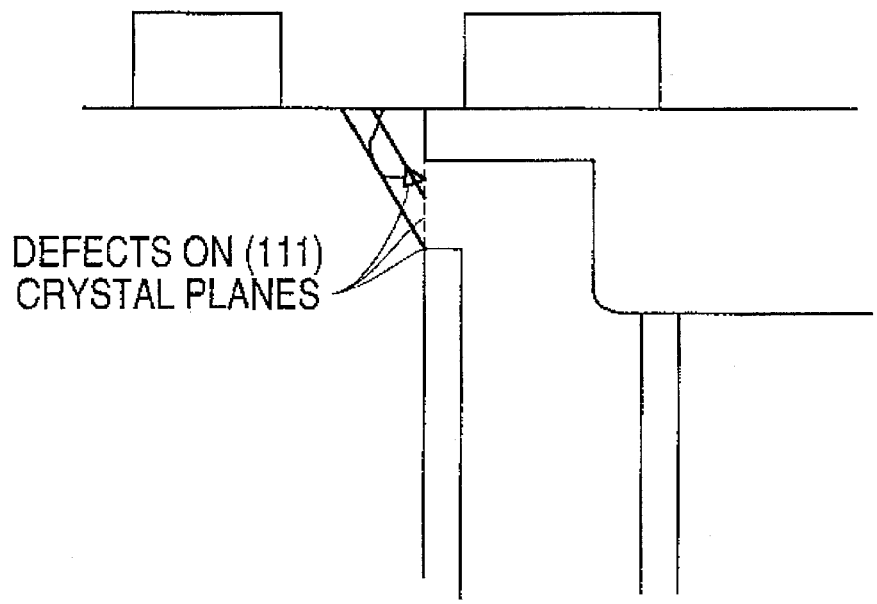

With reference to FIG. 6B, for the case where the interface is not recessed by a recrystallization, originating defects would always extend into the substrate.

Figure 7A:
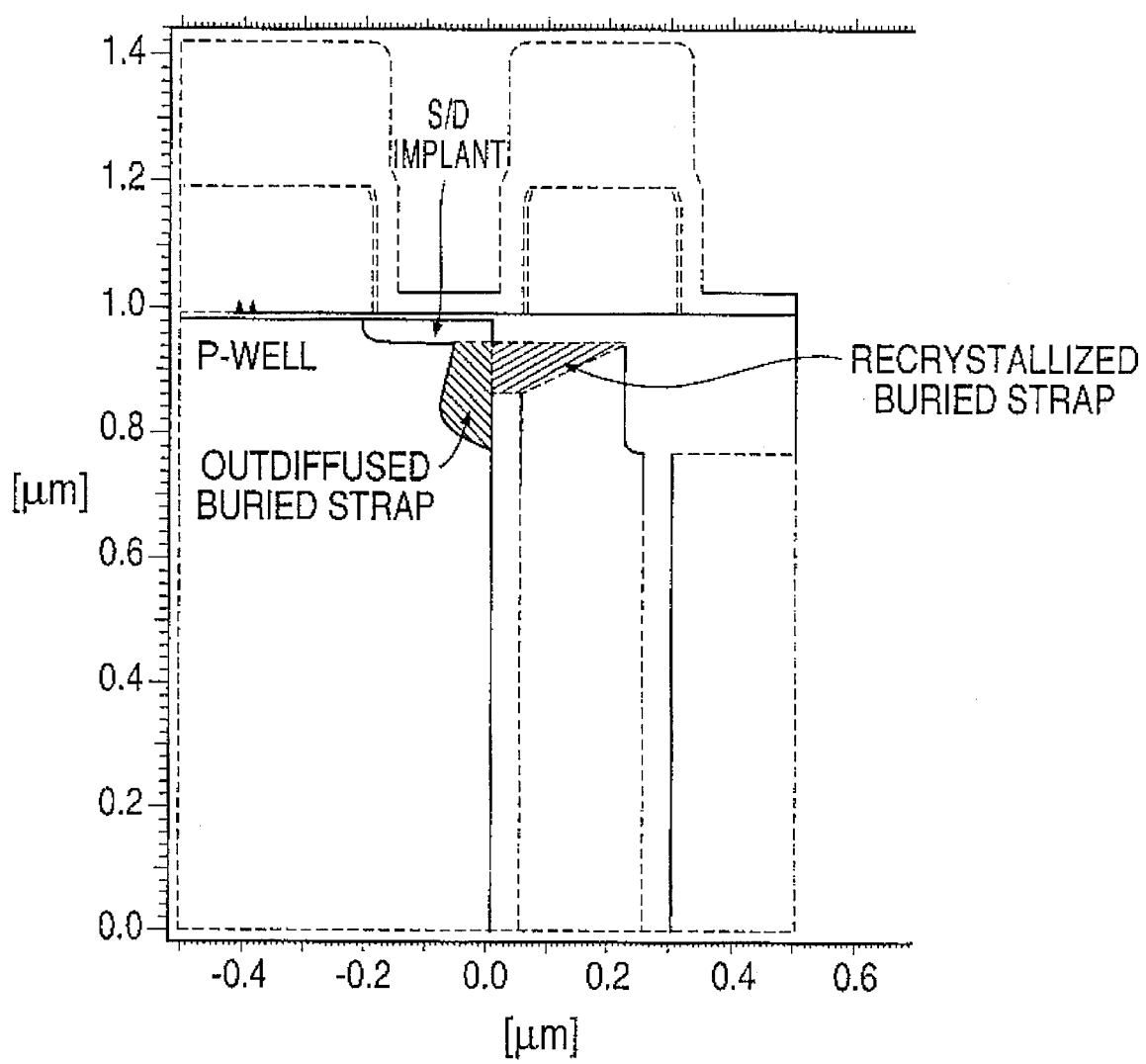
FIGS. 7A and 7B respectively illustrate buried straps formed in accordance with the method of the present invention and in accordance with a prior art method, respectively.

Thus, the controlled recrystallization of the upper part of the trench fill recesses the single/poly-crystalline interface behind the expanded collar oxide, thereby avoiding the generation and extension of crystal defects into the substrate, while simultaneously solving the problem of the limited thermal budget. The additional thermal budget gained by the buried strap recrystallization can be seen from FIGS. 7A and 7B. The outdiffusion of the buried strap is simulated for two cases. The first trench fill is assumed to be doped with (As) $5\times10^{19}$ cm$^{-2}$ and the second and third trench fills are assumed to be undoped. The p-well doping around the trench is (B) $2\times10^{17}$cm$^{-2}$. FIG. 7A shows a trench with a recrystallized buried strap. The simulation is based upon the thermal budget for the fabrication process (which does not include any stress relief anneals) plus an additional thermal budget for stress relief of, for example, 90 minutes at 1050° C. Of course, 90 minutes at 1050° is merely exemplary of the additional thermal budget which may be gained in accordance with this invention. The Dt product (D=temperature dependent diffusion coefficient of outdiffusing dopants, t=diffusion time) allows longer times at lower temperatures, or shorter times at higher temperatures. As can be seen with reference to FIG. 7A, the outdiffused buried strap overlaps the source/drain region so that good contact is guaranteed. The junction width of the buried strap to the P-well is below 0.1 micrometer so that there is no effect on the transfer device characteristics. Further, there is no chance of electrical leakage to the buried strap of neighboring cells.

Figure 7B:
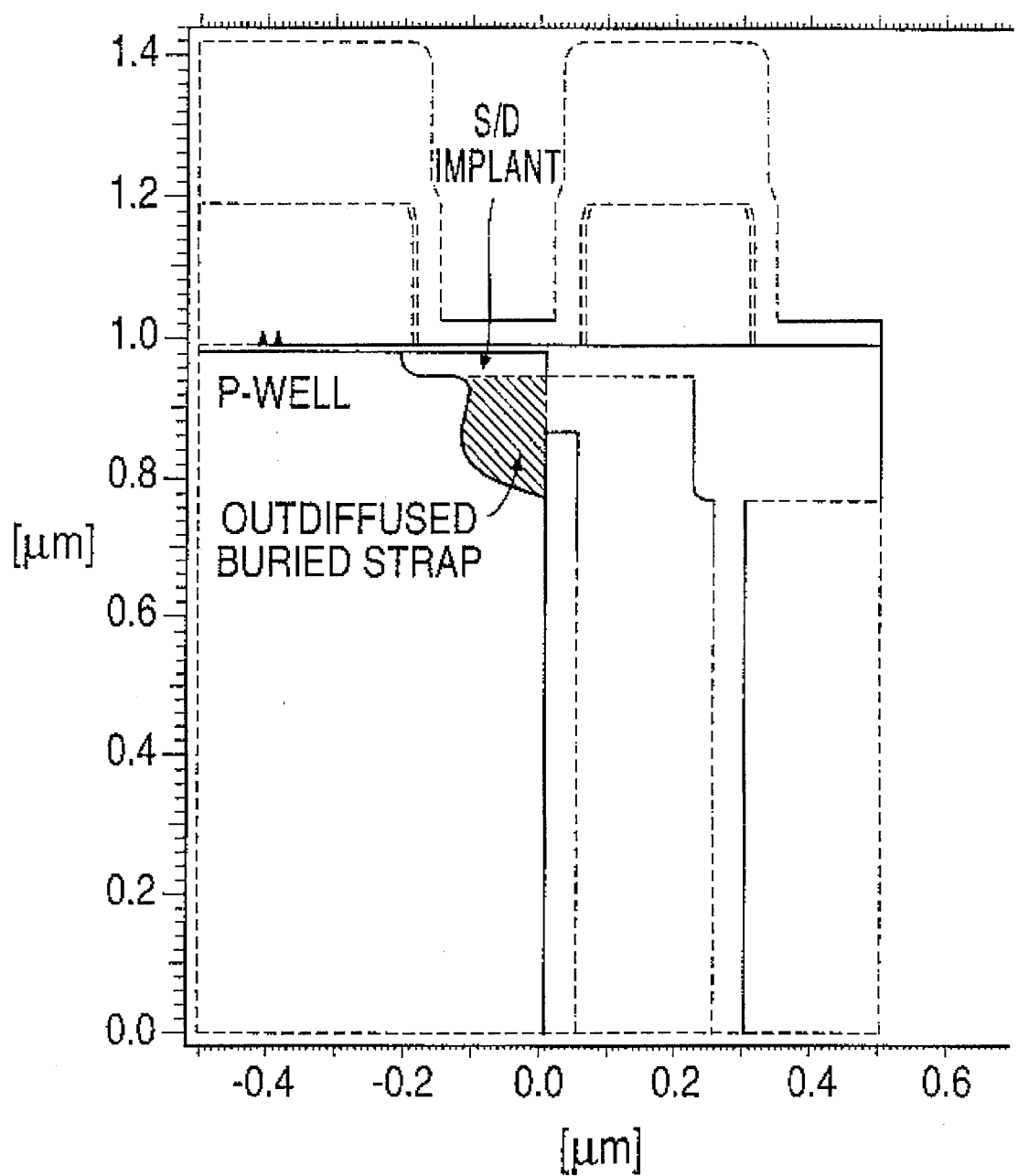

FIG. 7B shows an identical structure, simulated with the same thermal budget as in FIG. 7A, but without buried strap recrystallization. The buried strap outdiffusion of about 0.15 micrometers may already influence the transfer device characteristics. In this structure, a perfect overlay alignment of the transfer gate to the trenches is assumed. However, if the overlay of the transfer gate to the trench deviates from the perfect alignment position up to its maximum permitted value of 0.1 micrometer, the outdiffused buried strap reaches underneath the transfer gate. The electrical characteristics of the transfer device will be strongly affected. Also the possibility of cell-to-cell leakage via buried straps of neighboring cells is much higher than in the case without buried strap recrystallization.

The simulations show clearly that with the buried strap recrystallization, a much higher thermal budget of the fabrication process is allowed. The additional thermal budget of, for example, at least 90 minutes at 1050° C. which is gained by the controlled recrystallization of the third trench fill, can be used for appropriate stress relief anneals without any excessive dopant outdiffusion from the trench.

While the invention has been described in detail with reference to the appended drawings, the invention is limited in scope only by the claims. Moreover, any publication cited herein should be construed to be incorporated by reference as to any subject matter deemed essential to the present disclosure.

We claim:

1. A method of forming a coupled capacitor and transistor, the method comprising the steps of:

forming a trench in a semiconductor substrate;

forming an impurity-doped first conductive region by filling said trench with an impurity-doped first conductive material;

etching back said impurity-doped first conductive region to a first level within said trench;

forming an insulating layer on a sidewall of the portion of said trench opened by the etching back of said impurity-doped first conductive region;

forming a second conductive region by filling the remainder of said trench with a second conductive material;

etching back said insulating layer and said second conductive region to a second level within said trench;

forming an undoped amorphous silicon layer in the portion of said trench opened by the etching back of said insulating layer and said second conductive region;

etching back said undoped amorphous silicon layer to a third level within said trench;

recrystallizing said amorphous silicon layer;

outdiffusing impurities from said impurity-doped first conductive region to said semiconductor substrate through said recrystallized silicon layer; and forming a source/drain region of said transistor adjacent to an intersection of said trench and the surface of said semiconductor substrate, said outdiffused impurities and said recrystallized silicon layer constituting a buried strap for electrically connecting said first and second conductive layers in said trench to said source/drain region.

2. The method according to claim 1, wherein said amorphous silicon layer is recrystallized by a heat treatment at approximately 550 degrees Celsius in a nitrogen ambient.

3. The method according to claim 1, wherein a native oxide is removed from the portion of said trench opened by the etching back of said insulating layer and said second conductive region prior to the step of forming an amorphous silicon layer.

4. The method according to claim 1, wherein said impurity-doped first conductive material is N+ polysilicon.

5. The method according to claim 1, wherein the step of forming a second conductive region comprises forming an impurity-doped second conductive region by filling the remainder of said trench with an impurity-doped second conductive material.

6. The method according to claim 5, wherein said impurity-doped second conductive material is N+ polysilicon.

7. A method of forming a buried strap for coupling a capacitor and a transistor, the method comprising the steps of:

forming a trench in a semiconductor substrate;

forming an impurity-doped first conductive region by filling said trench with an impurity-doped first conductive material;

etching back said impurity-doped first conductive region to a first level within said trench;

forming an insulating layer on a sidewall of the portion of said trench opened by the etching back of said impurity-doped first conductive region;

forming a second conductive region by filling the remainder of said trench with a second conductive material;

etching back said insulating layer and said second conductive region to a second level within said trench;

forming an amorphous silicon layer in the portion of said trench opened by the etching back of said insulating layer and said second conductive region;

recrystallizing said amorphous silicon layer; and outdiffusing impurities from said impurity-doped first conductive region to semiconductor substrate through said recrystallized silicon layer, whereby said outdiffused impurities and the recrystallized silicon layer form said buried strap.

8. The method according to claim 7, wherein said amorphous silicon layer is recrystallized by a heat treatment at approximately 550 degrees Celsius in a nitrogen ambient.

9. The method according to claim 7, wherein a native oxide is removed from the portion of said trench opened by the etching back of said insulating layer and said second conductive region prior to the step of forming an amorphous silicon layer.

10. The method according to claim 7, wherein said impurity-doped first conductive material is N+ polysilicon.

11. The method according to claim 7, wherein the step of forming a second conductive region comprises forming an impurity-doped second conductive region by filling the remainder of said trench with an impurity-doped second conductive material.

12. The method according to claim 11, wherein said impurity-doped second conductive material is N+ polysilicon.

13. A method of manufacturing a semiconductor memory device, the method comprising the steps of:

forming a trench in a semiconductor substrate;

forming a conductive region in said trench by filling said trench with a conductive material, at least an upper portion of said conductive region being insulatively spaced from said semiconductor substrate by an insulating layer and at least a portion of said conductive material being doped with impurities;

etching back said conductive region and said insulating layer to a level in said trench;

forming an amorphous undoped silicon layer in the portion of said trench opened by etching back said conductive region and said insulating layer;

recrystallizing the amorphous undoped silicon layer;

outdiffusing impurities from said impurity-doped polysilicon to said semiconductor substrate via said recrystallized silicon layer to form an outdiffused region; and forming a transfer gate having source/drain regions on a surface of said semiconductor substrate, said outdiffused region and the recrystallized silicon constituting a buried strap for electrically connecting said transfer gate to said conductive region.

14. The method according to claim 13, further comprising the step of:

removing a native oxide in the portion of said trench opened by etching back said conductive region and said insulating layer prior to the step of forming an amorphous undoped silicon layer.

15. The method according to claim 13, wherein the amorphous undoped silicon layer is recrystallized by heating at approximately 550 degrees Celsius in a nitrogen ambient.

* * * * *